United States Patent [19]

Pham et al.

[11] Patent Number: 5,107,228

[45] Date of Patent: Apr. 21, 1992

[54] VOLTAGE CONTROLLED OSCILLATOR EMPLOYING NEGATIVE RESISTANCE

[75] Inventors: Phuc C. Pham, Chandler; Carl Denig, Mesa, both of Ariz.

[73] Assignee: Motorola, Inc., Schaumburg, Ill.

[21] Appl. No.: 767,948

[22] Filed: Sep. 30, 1991

[51] Int. Cl.$^5$ .............................................. H03C 3/00
[52] U.S. Cl. ............................ 331/117 R; 331/177 R
[58] Field of Search ........ 331/108 R, 117 R, 117 FE, 331/167, 177 R

[56] References Cited

U.S. PATENT DOCUMENTS 3,593,204  7/1971  Healey, III ..................... 331/117 R
4,503,402  3/1985  Englund, Jr. ................. 331/117 R X

*Primary Examiner*—Robert J. Pascal
*Attorney, Agent, or Firm*—Bradley J. Botsch

[57] ABSTRACT

A voltage controlled oscillator circuit has been provided that allows for varying the center frequency of oscillation through an applied voltage signal ($V_F$). Further, the center frequency of oscillation can be fine tuned around the center frequency via a modulation signal ($S_M$). The voltage controlled oscillator circuit utilizes a negative resistance technique for oscillation and includes an output amplifier whose output resistance can be adjusted to match the input impedance of another circuit for maximum drive capability.

9 Claims, 2 Drawing Sheets

VOLTAGE CONTROLLED OSCILLATOR EMPLOYING NEGATIVE RESISTANCE

BACKGROUND OF THE INVENTION

This invention relates to oscillators, for example, a voltage controlled oscillator circuit employing a negative resistance technique.

Voltage controlled oscillator (VCO) circuits are well known in the art and are utilized in a number of applications. A VCO circuit is typically responsive to a control signal that is varied to adjust the frequency of an output signal of the VCO circuit.

An oscillator circuit may be converted to a psuedo voltage controlled oscillator circuit wherein the oscillation frequency of the oscillator circuit is determined by an external inductor (L) and capacitor (C) tank circuit. Further, by utilizing an external varactor to function as the capacitor of the external LC tank circuit, the capacitance of the varactor can be varied by varying the voltage applied to the varactor. As a result, the resonant frequency of the external LC tank circuit is correspondingly varied thereby varying the oscillation frequency of the oscillator circuit. However, a varactor is very expensive. Further, the varactor increases the phase noise of the oscillation circuit.

A prior art voltage controlled oscillator circuit that does not utilize a varactor is fully disclosed in an article entitled "Varactorless VCOs: Transistors go it alone", on pages 137-142 of the June 1984 issue of Microwaves & RF. Referring to FIG. 2 of the article, a modified Colpitts oscillator is shown. In particular, an adjustable voltage is applied to the base of a transistor to vary the base-emitter voltage and emitter current of the transistor. This, in turn, varies the emitter-base capacitance of the transistor. Further, by varying the emitter-base capacitance of the transistor, the capacitance of the LC tank circuit is varied and the oscillation frequency of the oscillator circuit is varied. However, since the adjustable voltage is applied to the base of the transistor, the adjustable voltage has a prominent effect on the bias of the transistor. For example, as the adjustable voltage is lessened, the voltage swing of the output signal of the oscillator circuit is reduced since the transistor is not properly biased. In addition, the output signal of the oscillator circuit is not symmetrical.

Hence, there exists a need to provide an improved VCO circuit having voltage controlled tuning capability while maintaining symmetry and adequate voltage of the output signal of the VCO circuit.

SUMMARY OF THE INVENTION

Briefly, there is provided a voltage controlled oscillator circuit having first, second and third terminals, an external inductor being coupled across the first and second terminals, a control voltage being applied to the third terminal, comprising an oscillator circuit being coupled to the first and second terminals for providing an output signal having a predetermined center frequency, the oscillator circuit including a transistor having a predetermined negative input resistance such that the oscillator circuit sustains oscillation, the oscillator circuit being responsive to the control voltage such that when the control voltage is varied, the center frequency of the output signal of the oscillator circuit is varied; and an output amplifier having an input and an output, the input of the output amplifier being coupled to receive the output signal of the oscillator circuit, the output of the output amplifier being coupled to an output terminal of the voltage controlled oscillator circuit, the output amplifier having an adjustable output impedance.

The present invention will be better understood from the following detailed description taken in conjunction with the accompanying drawings.

DETAILED DESCRIPTION OF THE DRAWINGS

Figure 1:
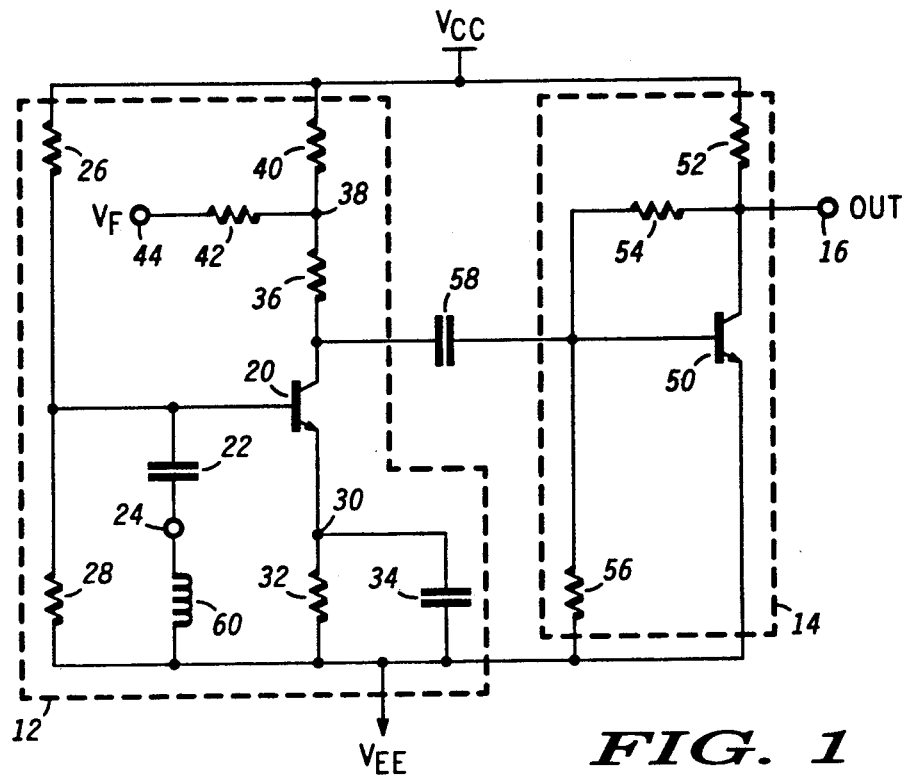
FIG. 1 is a detailed schematic diagram illustrating a voltage controlled oscillator circuit in accordance with the present invention.

Referring to FIG. 1, a detailed schematic diagram illustrating a voltage controlled oscillator (VCO) circuit is shown comprising oscillator circuit 12 and output amplifier 14. The output of the VCO circuit is provided at terminal 16.

Oscillator circuit 12 includes transistor 20 having a base coupled through capacitor 22 to terminal 24. The base of transistor 20 is also coupled through resistor 26 to a first supply voltage terminal at which the operating potential $V_{CC}$ is applied, for example 5 volts. In a similar manner, the base of transistor 20 is also coupled through resistor 28 to a second supply voltage terminal at which the operating potential $V_{EE}$ is applied, for example, ground reference.

The emitter of transistor 20 is coupled to circuit node 30 wherein resistor 32 and capacitor 34 are coupled in parallel between circuit node 30 and the second supply voltage terminal. The collector of transistor 20 is coupled to an output of oscillator circuit 12 and through resistor 36 to circuit node 38.

Resistor 40 is coupled between circuit node 38 and the first supply voltage terminal. Resistor 42 is coupled between circuit node 38 and terminal 44 at which voltage signal $V_F$ is applied.

Output amplifier 14 includes transistor 50 having a collector coupled to terminal 16 and through resistor 52 to the first supply voltage terminal. The base of transistor 50 is coupled through feedback resistor 54 to the collector of transistor of 50. Further, the base of transistor of 50 is coupled through resistor 56 to the second supply voltage terminal. The emitter of transistor 50 is coupled to the second supply voltage terminal. Also, the input of amplifier 14 is capacitively coupled to the output of oscillator circuit 12 whereby coupling capacitor 58 is coupled between the collector of transistor 20 and the base of transistor of 50.

External inductor 60 is coupled between terminals 24 and 61 wherein terminal 61 is coupled to the second supply voltage terminal.

In operation, resistors 26 and 28 form a voltage divider network for operating potential $V_{CC}$ to provide a predetermined bias voltage at the base of transistor 20. This predetermined bias voltage is level shifted down by one diode voltage via the base-emitter of transistor 20 and subsequently appears at circuit node 30. By providing a fixed voltage at circuit node 30, a fixed current through transistor 20 is determined via resistor 32. Thus, transistor 20 is biased to have a predetermined collector current.

Oscillator circuit 12 will oscillate if the total resistance in the loop formed by inductor 60, capacitor 22, transistor 20 and the parallel combination of resistor 32 and capacitor 34 is negative. This is based on the fact that an ideal tuned circuit will oscillate indefinitely if there is no resistance element present to dissipate energy. Thus, oscillator circuit 12 will oscillate if the real part of the input impedance of transistor 20 is sufficiently negative to yield an overall negative resistance for the loop.

The analysis of calculating the input resistance of transistor 20 is discussed in detail on pages 243-245 of "Modern Communication Circuits", McGraw-Hill Publishing Co., 1985. The final result for the real part of the input impedance ($r_i$) of transistor 20 is shown in EQN. 1.

$$r_i = -g_m/(w^2 \times C_{BE} \times C_E) \quad (1)$$

where
$g_m$ is the transconductance of transistor 20;
w is the operating frequency;
$C_{BE}$ is the base-emitter capacitance of transistor 20; and
$C_E$ the capacitance seen at the emitter of transistor 20.

It must be understood that if the magnitude of $r_i$ as shown in EQN. 1 is greater than the sum of any other resistances within the loop, then transistor 20 will be able to supply the dissipated energy of the inductor (or capacitor). Thus, oscillator circuit 12 will be able to sustain oscillation.

As a result, the signal appearing at the collector of transistor 20 is an oscillatory signal which oscillates at a center frequency ($F_C$) substantially equal to $[2 \times pi \times (L \times C_{equiv})^{-\frac{1}{2}}]$ where L is the inductance of external inductor 60 and $C_{equiv}$ is the equivalent capacitance of the loop as expressed in EQN. 2.

$$C_{equiv} = [C_{22} \| C_{34} \| (C_{BE} + C_{CB} + C_{CE})] \quad (2)$$

where
$C_{BE}$ is the base-emitter capacitance of transistor 20;
$C_{CB}$ is the collector-base capacitance of transistor 20;
$C_{CE}$ is the collector-emitter capacitance of transistor 20; and
$\|$ means "in parallel with".

When voltage $V_F$ is varied from operating potential $V_{EE}$ to operating potential $V_{CC}$, the equivalent resistance between circuit node 38 and operating potential $V_{CC}$ varies. As a result, the voltage at circuit node 38, as well as the voltage at the collector of transistor 20, will vary.

As an example, suppose that voltage $V_F$ is substantially increased to operating potential $V_{CC}$. This effectively places resistor 42 in parallel with resistor 40 thereby making the equivalent resistance between circuit node 38 and the first supply voltage terminal equal to ($R_{108} \| R_{110}$). This has the effect of decreasing the equivalent resistance between circuit node 38 and the first supply voltage terminal. This decreases the voltage drop between circuit node 38 and the first supply voltage terminal. As a result, the collector-emitter voltage across transistor 20 is increased.

On the other hand, as voltage $V_F$ is substantially decreased to operating potential $V_{EE}$, resistor 42 has less of an effect on the equivalent resistance between circuit node 38 and the first supply voltage terminal. This has the effect of increasing the equivalent resistance between circuit node 38 and the first supply voltage terminal. This increases the voltage drop between circuit node 38 and the first supply voltage terminal. As a result, the collector-emitter voltage across transistor 20 is decreased.

Moreover, by varying the collector-emitter voltage across transistor 20, the collector-base capacitance, the collector-emitter capacitance, and the base-emitter capacitance of transistor 20 is correspondingly varied. This has the effect of varying the equivalent capacitance of the tank circuit as expressed in EQN. 2. Furthermore, the center frequency of oscillator circuit 12 is varied.

In particular, if voltage $V_F$ is increased, the center frequency of oscillator circuit 14 is increased. On the other hand, if voltage $V_F$ is decreased, the center frequency of oscillator circuit 12 is decreased.

In summary, as voltage $V_F$ is varied, the center frequency of oscillation of oscillator circuit 12 is varied. Thus, the circuit shown in FIG. 1 is a voltage controlled oscillator circuit whose frequency can be adjusted via voltage $V_F$.

Output amplifier 14 is essentially an inverting amplifier having its inverting input at the base of transistor 50, its output at the collector of transistor 50, and its noninverting input at the emitter of transistor 50 which is coupled to the second supply voltage terminal.

Resistor 54 is a negative feedback resistor coupled between the the output and inverting input of amplifier 14. Further, resistor 56 functions as a source resistor being coupled between the inverting input and the second supply voltage terminal. Therefore, the oscillatory signal appearing at the base of transistor 50 is amplified by the ratio of resistor 54 to resistor 56 ($R_{54}/R_{56}$) and subsequently supplied to terminal 16. In addition, resistor 52 can be chosen to set the bias current through output amplifier 14.

A great advantage of output amplifier 14 is that its output impedance (the impedance seen with feedback from terminal 20 to the collector of transistor 50) can be adjusted to be a predetermined impedance, for example 50 ohms.

By utilizing the small signal model for transistor 50, the output impedance of amplifier 14 with feedback ($R_{OUT(14)}$) can be simplified to the expression shown in EQN. 3.

$$R_{OUT(14)} = (R_{52} \| R_{44})/[1 - Bxg_m(R_{52} \| R_{54})(R_{56} \| R_{54} \| r_{pi})] \quad (3)$$

where
($R_{52} \| R_{54}$) is the equivalent resistance seen looking in from the collector of transistor 50;
B is the loop gain which is substantially equal to ($-1/R_{54}$);
$g_m$ and $r_{pi}$ are respectively the transconductance and the small signal input resistance of transistor 50; and
($R_{56} \| R_{54} \| r_{pi}$) is the equivalent resistance seen looking in from the base of transistor 50.

The values for $g_m$ and $r_{pi}$ are dependent upon the collector current through transistor 50, as is well known. Further, the collector current through transistor 50 can be adjusted by choosing different values for resistor 52. Hence, the output impedance of amplifier 14 with feedback ($R_{OUT(14)}$) can easily be adjusted by choosing different values for resistor 52.

In summary, the output resistance seen from looking in from terminal 20 can be adjusted via resistor 52. Thus, output impedance of the VCO circuit of FIG. 1 can be designed to match the input impedance of a circuit (not shown) coupled to terminal 20 for maximum drive capability.

Figure 2:
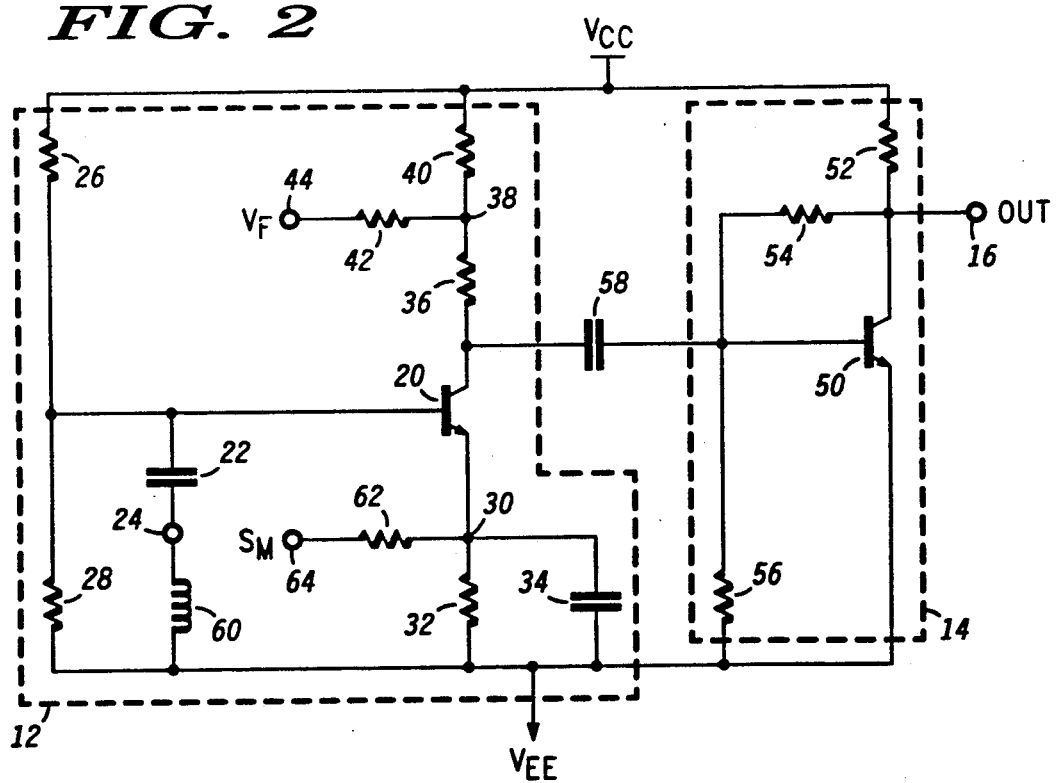
FIG. 2 is a detailed schematic diagram illustrating an alternate embodiment of a voltage controlled oscillator circuit in accordance with the present invention.

Referring to FIG. 2, a detailed schematic diagram illustrating an alternate embodiment of a voltage controlled oscillator circuit is shown. It is understood that components shown in FIG. 2 which are identical to the components shown in FIG. 1 are identified by the same reference numbers.

The circuit of FIG. 2 further includes resistor 62 coupled between circuit node 30 and terminal 64 whereby signal Sm is applied to terminal 64.

In operation, signal Sm, typically an AC signal, is applied to terminal 64. The signal appearing at circuit node 30 is an attenuated version of signal $S_M$ via the resistor divider network formed by resistors 62 and 32.

By applying signal $S_M$ to terminal 64, a frequency modulation effect is created such that as the frequency of signal Sm increases, the center frequency of oscillation of oscillator circuit 12 slightly increases. On the other hand, as the frequency of signal Sm decreases, the center frequency of oscillation of oscillator circuit 12 slightly decreases. As a result, by varying the frequency of signal $S_M$, the center frequency of oscillation can be adjusted to a high degree of resolution around the center frequency of oscillation. For example, the center frequency of the output signal of oscillator circuit 12 may be 100 MHz, while signal $S_M$ allows the center frequency to be adjusted within Kilohertz of the center frequency.

It is worth noting that the circuits shown in FIGS. 1 and 2 may operate with a negative or positive supply voltage wherein operating potential $V_{CC}$ is a positive voltage and operating potential $V_{EE}$ is ground, or wherein operating potential $V_{CC}$ is ground and operating potential $V_{EE}$ is a negative voltage. Further, it is understood that inductor 60 would be coupled between terminal 24 and ground.

Figure 3:
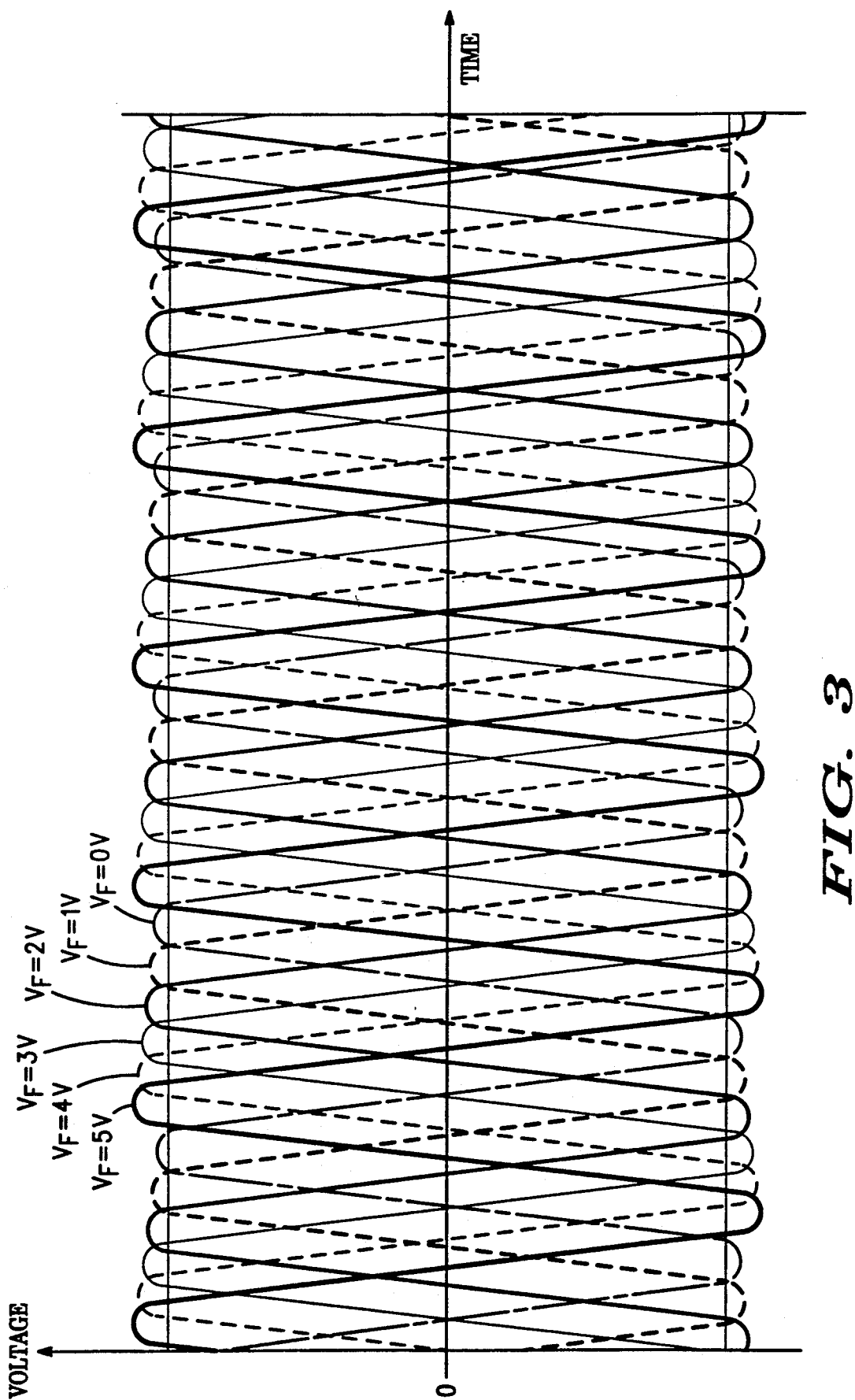
FIG. 3 is a graphical diagram illustrating typical output signals of the voltage controlled oscillator circuit of FIG. 1.

Referring to FIG. 3, a graphical diagram illustrating typical simulated output signals appearing at terminal 16 of the voltage controlled oscillator circuit of FIG. 1 is shown. It is understood that the signal appearing at terminal 16 is passed through a series coupling capacitor and a termination resistor to generate the simulated output signal. As can be seen, the voltage swing of the output signal is relatively constant for the full adjustable range of $V_F$ from 0 to 5 volts wherein the voltage swing slightly decreases as voltage $V_F$ decreases. Further, the output signals in FIG. 3 illustrate that as voltage $V_F$ increases, the frequency of oscillation also increases.

By now it should be apparent from the foregoing discussion, that a novel voltage controlled oscillator circuit has been provided that allows varying the frequency of oscillation through an applied voltage signal ($V_F$) or a modulation signal ($S_M$). Further, the voltage controlled oscillator circuit utilizes a negative resistance technique for oscillation and includes an output amplifier whose output resistance can be adjusted.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

We claim:

1. A voltage controlled oscillator circuit having first, second and third terminals, an external inductor being coupled across the first and second terminals, a control voltage being applied to the third terminal, comprising:

an oscillator circuit being coupled to the first and second terminals for providing an output signal having a predetermined center frequency, said oscillator circuit including a transistor having a predetermined negative input resistance such that said oscillator circuit sustains oscillation, said oscillator circuit being responsive to the control voltage such that when the control voltage is varied, said center frequency of said output signal of said oscillator circuit is varied; and an output amplifier having an input and an output, said input of said output amplifier being coupled to receive said output signal of said oscillator circuit, said output of said output amplifier being coupled to an output terminal of the voltage controlled oscillator circuit, said output amplifier having an adjustable output impedance.

2. The voltage controlled oscillator circuit according to claim 1 wherein said oscillator circuit includes:

said transistor having a collector, a base and an emitter, said collector of said transistor being coupled to provide said output signal of said oscillator circuit;

a first resistor being coupled between said base of said transistor and a first supply voltage terminal;

a second resistor being coupled between said base of said transistor and a second supply voltage terminal;

a third resistor being coupled between said emitter of said transistor and said second supply voltage terminal;

a fourth resistor being coupled between said collector of said transistor and a first circuit node;

a fifth resistor being coupled between said first circuit node and said first supply voltage terminal;

a sixth resistor being coupled between said first circuit node and the third terminal;

a first capacitor being coupled between said base of said transistor and the first terminal; and a second capacitor being coupled between said emitter of said transistor and said second supply voltage terminal.

3. The voltage controlled oscillator circuit according to claim 2 wherein said output amplifier includes:

a first transistor having a collector, a base and an emitter, said collector of said first transistor of said output amplifier being coupled to said said output terminal of the voltage controlled oscillator circuit, said base of said first transistor of said output amplifier being coupled to receive said output signal of said oscillator circuit, said emitter of said first transistor of said output amplifier being coupled to said second supply voltage terminal;

a first resistor being coupled between said base and collector of said first transistor of said output amplifier;

a second resistor being coupled between said collector of said first transistor of said output amplifier and said first supply voltage terminal; and a third resistor being coupled between said base of said first transistor of said output amplifier and said second supply voltage terminal.

4. The voltage controlled oscillator circuit according to claim 3 further including a third capacitor being coupled between said collector of said transistor of said oscillator circuit and said base of said first transistor of said output amplifier.

5. A voltage controlled oscillator circuit having first, second and third terminals, an external inductor being coupled across the first and second terminals, a control voltage being applied to the third terminal, comprising:

an oscillator circuit being coupled to the first and second terminals for providing an output signal having a predetermined center frequency, said oscillator circuit including a transistor having a predetermined negative input resistance such that said oscillator circuit sustains oscillation, said oscillator circuit being responsive to the control voltage such that when the control voltage is varied, said center frequency of said output signal of said oscillator circuit is varied;

a modulation circuit for applying an ac voltage signal to said oscillator circuit such that the frequency of said output signal of said oscillator circuit is modulated around said predetermined center frequency; and an output amplifier having an input and an output, said input of said output amplifier being coupled to receive said output signal of said oscillator circuit, said output of said output amplifier being coupled to an output terminal of the voltage controlled oscillator circuit, said output amplifier having an adjustable output impedance.

6. The voltage controlled oscillator circuit according to claim 5 wherein said oscillator circuit includes:

said transistor having a collector, a base and an emitter, said collector of said transistor being coupled to provide said output signal of said oscillator circuit;

a first resistor being coupled between said base of said transistor and a first supply voltage terminal;

a second resistor being coupled between said base of said transistor and a second supply voltage terminal;

a third resistor being coupled between said emitter of said transistor and said second supply voltage terminal;

a fourth resistor being coupled between said collector of said transistor and a first circuit node;

a fifth resistor being coupled between said first circuit node and said first supply voltage terminal;

a sixth resistor being coupled between said first circuit node and the third terminal;

a first capacitor being coupled between said base of said transistor and the first terminal; and a second capacitor being coupled between said emitter of said transistor and said second supply voltage terminal.

7. The voltage controlled oscillator circuit according to claim 6 wherein said output amplifier includes:

a first transistor having a collector, a base and an emitter, said collector of said first transistor of said output amplifier being coupled to said output terminal of the voltage controlled oscillator circuit, said base of said first transistor of said output amplifier being coupled to receive said output signal of said oscillator circuit, said emitter of said first transistor of said output amplifier being coupled to said second supply voltage terminal;

a first resistor being coupled between said base and collector of said first transistor of said output amplifier;

a second resistor being coupled between said collector of said first transistor of said output amplifier and said first supply voltage terminal; and a third resistor being coupled between said base of said first transistor of said output amplifier and said second supply voltage terminal.

8. The voltage controlled oscillator circuit according to claim 7 wherein said modulation circuit includes a first resistor having first and second terminals, said first terminal of said first resistor of said modulation circuit being coupled to said emitter of said transistor of said oscillator circuit, said second terminal of said first resistor of said modulation circuit being coupled to receive said ac voltage signal.

9. The voltage controlled oscillator circuit according to claim 8 further including a third capacitor being coupled between said collector of said transistor of said oscillator circuit and said base of said first transistor of said output amplifier.

* * * * *